United States Patent [19]
Machui et al.

[11] Patent Number: 5,365,206
[45] Date of Patent: Nov. 15, 1994

[54] SURFACE ACOUSTIC WAVE REFLECTOR FILTER HAVING Z-SHAPED PROPAGATION PATHS

[75] Inventors: Jürgen Machui; Werner Ruile, both of München, Germany

[73] Assignee: Siemens Aktiengesellschaft, Munich, Germany

[21] Appl. No.: 856,044

[22] PCT Filed: Nov. 14, 1990

[86] PCT No.: PCT/DE90/00876
  § 371 Date: May 13, 1992
  § 102(e) Date: May 13, 1992

[87] PCT Pub. No.: WO91/07818
  PCT Pub. Date: May 30, 1991

[30] Foreign Application Priority Data

Nov. 14, 1989 [DE] Germany ................. 3937871
Jun. 12, 1990 [DE] Germany ................. 4018784

[51] Int. Cl.⁵ ............................................ H03H 9/64
[52] U.S. Cl. ................................ 333/195; 310/313 D
[58] Field of Search .......................... 333/193–195, 333/150, 153–155; 310/313 R, 313 B, 313 C, 313 D

[56] References Cited

U.S. PATENT DOCUMENTS

| | | | |
|---|---|---|---|
| 3,559,115 | 1/1971 | DeVries | 333/194 |
| 3,983,517 | 9/1976 | Weglein | 333/195 |
| 4,166,228 | 8/1979 | Solie | 333/155 X |
| 4,206,426 | 6/1980 | Solie et al. | 333/153 X |
| 4,319,154 | 3/1982 | Solie | 310/313 D |
| 4,331,943 | 5/1982 | Cross et al. | 333/194 |
| 4,484,160 | 11/1984 | Riha | 333/195 |
| 4,520,330 | 5/1985 | Riha | 333/195 |
| 4,736,172 | 4/1988 | Ebneter | 333/193 |

FOREIGN PATENT DOCUMENTS

| | | | |
|---|---|---|---|
| 0032313 | 7/1981 | European Pat. Off. | |
| 0054723 | 6/1982 | European Pat. Off. | |
| 69919 | 6/1981 | Japan | 333/195 |
| 58408 | 4/1982 | Japan | 333/155 |
| 122109 | 7/1984 | Japan | 333/155 |
| 59-139714 | 8/1984 | Japan | |

OTHER PUBLICATIONS

"Correction Factor Low Loss 180° Reflecting Linear Chirp Arrays in Saw Devices", Huang, IEEE Trans, Ultrasonics, vol. 35 (1988), pp. 61–65.

"A Low Loss Narrowband Surface Acoustic Wave Filter at UHF Is Realized With Two Track Group Type Unidirectional Transducers" by Ovnat, Tadiran, Communications Division, Technology Center, P.O. B. 267, Holon, Israel, pp. 1–4; Proceedings of the 15th Conference of Electrical and Electronics Engineers in Israel; 7–9 Apr. 1987.

*Primary Examiner*—Benny Lee
*Attorney, Agent, or Firm*—Hill, Steadman & Simpson

[57] ABSTRACT

A surface-wave filter in which the acoustic wavepath is reflected in order to reduce the substrate size necessary. The reflections are chosen so that interference due to temperature effects is excluded. The use of filters of this kind as partial filters in a combined filter enables crosstalk to be further reduced.

25 Claims, 4 Drawing Sheets

SURFACE ACOUSTIC WAVE REFLECTOR FILTER HAVING Z-SHAPED PROPAGATION PATHS

BACKGROUND OF THE INVENTION

The present invention relates to a reflector filter operating with surface acoustic waves, having an input transducer, an output transducer and having reflector structures which are effective connected in series for the path of surface acoustic waves between input transducer and output transducer and which deflect the direction of the acoustic waves several times between input transducer and output transducer.

U.S. Pat. Nos. 4,484,160 and 4,520,330 disclose a surface-wave reflector filter, known as RAC filter, having an input transducer, an output transducer and two reflector structures which, with reflector fingers positioned obliquely, face each other (lying next to one another) in such a way that an acoustic wave proceeding into one reflector is deflected by approximately 90° and proceeds into the other reflector and is fed by the latter again with an approximately 90° change of direction to the output transducer. A filter of this type is suitable for providing a time period. The finger structures of the aforesaid reflectors can be weighted and/or dispersive in accordance with the desired transmission function. In particular, finger displacement weighting, finger omission weighting and finger rotation can be provided as finger weighting. Such a known reflector filter has two acoustic tracks, namely one track with the input transducer and one reflector, and the second track extending parallel thereto with the other reflector and the output transducer. The tracks coincide with the respective main wave propagation direction of the transducer associated with the track in question.

The disadvantages of a reflector filter of this type are a certain temperature dependency of the angle accuracy of the reflection, to be precise even in the case of a substrate made of quartz, and a certain Mount of transmission losses. However, a reflector filter of this type requires only a minimum size substrate, since for reasons of stability the width of an oblong substrate plate in question here could not be made optimally small for example, for an in-line arrangement, taking only the space requirement for the structure into consideration. The selectivity of such a filter is essentially determined by the effective acoustic length of the reflectors.

Filter structures are described in European reference EP-A-0 032 313 corresponding to U.S. Pat. No. 4,319,154) which have in each case reduced temperature sensitivity despite the angled acoustic path. Provided there for this purpose in each case is a trio of reflectors with alteration of the angle of the acoustic path. It is important for there filter structures that the angle of incidence and the angle of reflection of the wave are the same for the middle reflector of this trio. There are no requirements with respect to the magnitude of the respective change of direction, which are at least approximately, 90°.

Embodiments of multi-track reflector filters with multi-strip couplers are stated in IEEE Trans. Ultrasonics, Vol. 35 (1988), pages 61 ff. A further embodiment stated therein provides for a filter having input transducer, output transducer and two reflector structures which are arranged in-line with one another. There are two mutually independent paths of the acoustic wave between the input transducer and the output transducer. Inserted in each of these paths is only one reflector for acute-angled reflection of the one wave in each case. Temperature compensation of the reflection angle is not provided.

SUMMARY OF THE INVENTION

The object of the present invention is to state a reflector filter operating with surface acoustic waves, whose properties, including the reflection, exhibit an optimum temperature independency with the necessary substrate body being of the smallest possible size, in relation to the specified requirements with respect to selectivity, and if appropriate the filter also exhibiting thereby a minimum loss of signal energy (low loss). The filter should also preferably have low acoustic crosstalk.

This object is achieved with a reflector filter operating with surface acoustic waves which has the an input transducer with one main wave propagation direction, an output transducer with one main wave propagation direction, and a substrate, on the surface of which the input and output transducers are arranged in such a way that there is no coincidence of input transducer main wave propagation direction and output transducer main wave propagation direction. The filter further has two reflectors connected in series with respect to the respective acoustic path between the input transducer and the output transducer, which reflectors are arranged relative to the transducers and to one another in such a way that the acoustic wave between the transducers has two series-connected changes of direction in each case by an angle that is identical with respect to amount, and the changes of direction of the acoustic wave in such a respective reflector are greater than 155° and less than 180° so that an essentially Z-shaped or inverted Z-shaped wave propagation path is produced from the input transducer to the output transducer. Further advantageous refinements of such a filter emerge are as follows. Input transducer and output transducer can be arranged with at least such a wide lateral offset with respect to one another in the direction of their respective main wave propagation direction that crosstalk as a result of transverse directed waves is avoided. The input transducer and the output transducer can be unidirectional transducers. For the unidirectional effect of the transducer an additional 180° reflector is provided for a respective transducer which, in relation to the respective transducer, is arranged in the direction of the main wave propagation direction counter to one of the series-connected reflectors. The respective unidirectional transducer can be a multiphase transducer. Additional metallization surfaces can be provided on the surface of the substrate outside the transducers and reflectors for equalizing the wave propagation conditions. There can be provided to the input transducer and output transducer dual acoustic paths to the two ends of the transducers in each case, wherein there are arranged in each of these dual paths occurring two series-connected reflectors which bring about the changes of direction. Mutually opposite edges of the busbar of transducers and/or reflectors on the surface of the substrate can have a corrugated structure such that total reflection of an acoustic wave at such a corrugated edge is precluded.

For a further improved ratio of wanted signal to interference signal, two such filter structures having the same construction can be connected electrically parallel as partial filters in such a way that the respective output or input transducers respectively are electrically connected to one another with opposite phase, and the input or output transducers respectively are electrically connected to one another with equal phase. The acoustic path of the wanted signal between input transducer and output transducer in the one partial filter, by position of the reflectors in the material of the substrate at the mid-frequency of the filter, can differ from the acoustic path of the wanted signal in the other partial filter by (2n−1) times half the wavelength of the acoustic wave. In addition the arrangement and position of input transducer and output transducer relative to one another in the one partial filter can be identical to the mutual arrangement and position of input transducer and output transducer in the other partial filter. In this embodiment unidirectional input/output transducers can be provided. Two partial filters can be provided with in each case a dual acoustic path. The structures of both partial filters can be provided on a single-piece substrate. Each of the partial filters can be realized on its own substrate in each case wherein the partial filters are then only connected together electrically.

Within the meaning of the invention, "surface waves" are understood to be acoustic waves that propagate in or near the surface of a solid, which are more specifically specified as Rayleigh waves, Bleustein waves, SSBW waves (surface skimming bulk waves) and the like, and the occurrence of which in each case is a question of the orientation of the crystal direction of the substrate in relation to the arrangement of the surface wave structures.

Important features of the invention are the two reflectors connected in series with respect to the path of the acoustic waves between the one input transducer and the one output transducer, the change of direction brought about by the reflectors in each case lying within an angle range greater than approximately 155° and less than 180°. The entry direction and the emergence direction of the acoustic wave of a respective reflector therefore form a very acute angle with one another.

It is possible to provide as a further refinement a first pair, consisting of two series-connected reflectors, and a second pair of reflectors, likewise connected in series, wherein the two acoustic paths of these two reflector pairs are paths connected in parallel with one another with respect to the input transducer and the output transducer, that is to say the reflector pairs belong to two mutually independent acoustic paths.

Each of the two reflectors or three reflectors of the respective pair brings about an almost, but only almost, 180° change of direction of the acoustic wave proceeding into the respective reflector.

For a reflector filter at least one of the at least two reflectors lying in an acoustic path between input transducer and output transducer is designed to be weighted and/or dispersive.

As can better be seen from the figure description below, as a result of the two reflectors or the pairs each consisting of two reflectors, the acoustic path between input transducer and output transducer of the filter is a zig-zag or "Z" path. Such a Z path consists of two path portions parallel to one another, in which the acoustic wave propagates in the same direction (but with a parallel offset), and of the third path portion extending obliquely at an acute angle which connects the path portions. The two (acute-angled) changes of direction contained in the Z path (caused by the reflectors) produce a temperature compensation with respect to temperature-dependent reflection angles.

This zig-zag ensures that a relatively small size of substrate is required, namely approximately as for a reflector filter of the aforesaid U.S. Patent Specification described at the outset.

The acute-angled reflection of the acoustic wave in the reflectors which is essential for the invention ensures that the respective path of the acoustic wave extends as far as possible parallel to a single selected crystal direction of the substrate, namely as far as possible parallel to the main wave propagation direction of the input transducer and of the output transducer. In filters of the abovementioned U.S. Pat. Nos. 4,484,160, 4,520,330 and 4,319,154, due to the approximately 90° reflections a part of the path is directed transversely to the main wave propagation direction of the transducers.

It must be ensured in a reflector filter according to the invention that the acoustic wave reflected twice at a very acute angle on its path between input transducer and output transducer also passes through in each case the area of the substrate in which the input transducer and the output transducer are arranged on the surface of the substrate.

A filter according to the invention can even be designed in such a way that is has only optimum low loss of signal energy. The two series-connected reflectors (also the two reflectors of a respective reflector pair in an embodiment to be described in greater detail below) are already extremely low-loss in their reflection behavior owing to the approximately 155° to only approximately 180° back reflection, since with the invention essentially each reflector finger of one of the two reflectors therefore comes to interact with all reflector fingers of the other reflector (of the respective pair) and vice versa.

The direct acoustic crosstalk is minimized by arranging input transducer and output transducer in two adjacent tracks parallel to one another. If, in addition, said transducers are also laterally offset from one another within their tracks, as in accordance with FIG. 1 for example, then possible crosstalk as a result of a transverse directed wave directed 90° to the main propagation direction is additionally precluded with the present invention.

In a reflector filter according to the invention, input transducer and output transducer are arranged relative to one another in such a way that input transducer and output transducer do not "see" each other directly with respect to the acoustic wave. Each acoustic path occurring between the transducers extends via two acute-angled reflections in the reflectors, that is to say proceeds via weighted reflectors, the weighting of which ensures the specified transmission function of the reflector filter.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
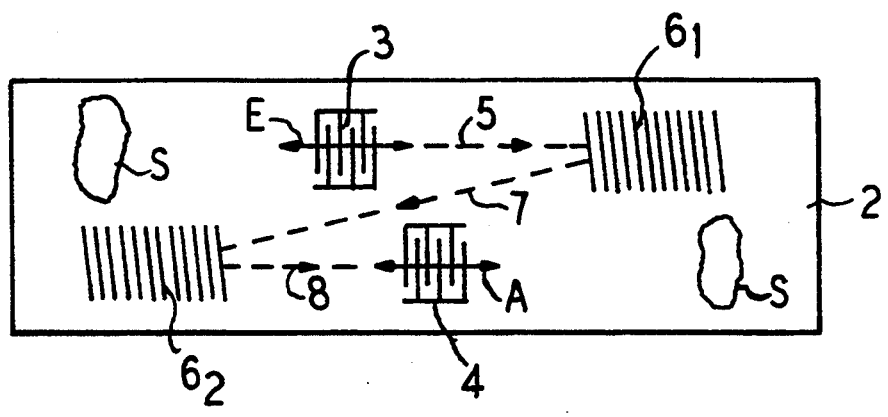
FIG. 1 shows a basic representation of an embodiment of the invention.
Figure 2:
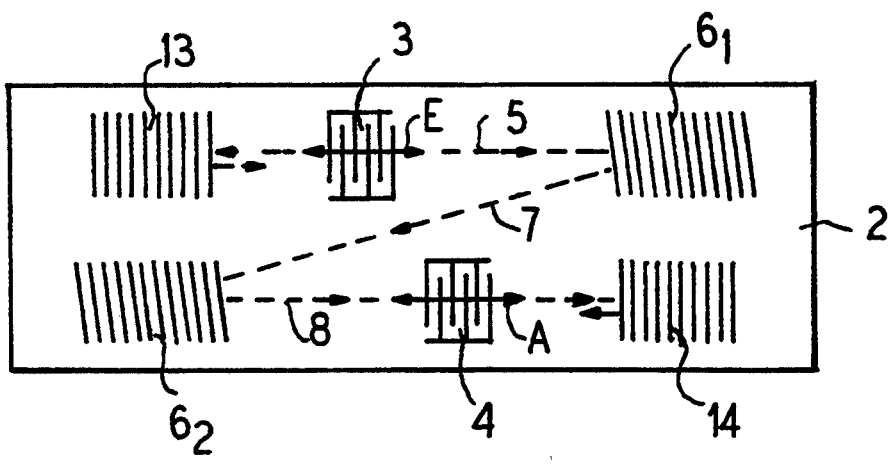
FIG. 2 shows such a representation of a first further development.
Figure 3:
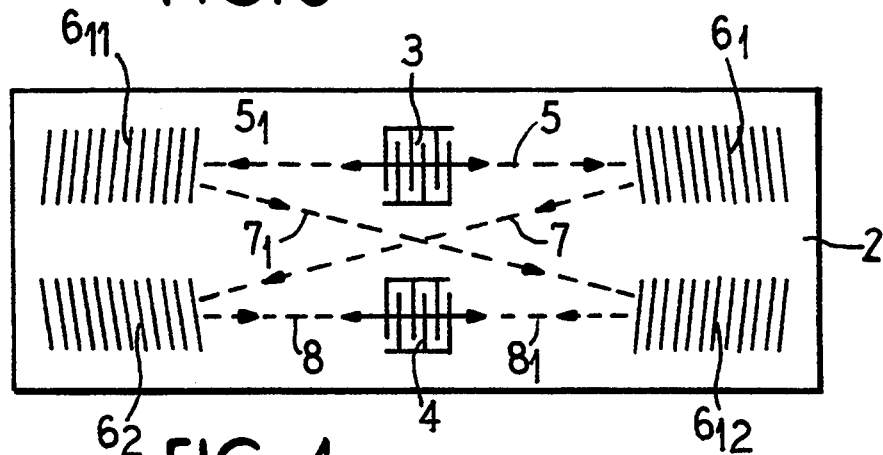
FIG. 3 shows such a representation of a second further development.

FIGS. 1 to 3 show diagrammatic basic arrangements of input transducer, output transducer and the associated reflectors to one another. On a substrate 2 represented by its outline, the filter of FIG. 1 has two transducers 3, 4, of which, for example, the transducer 3 can be connected as input transducer and the transducer 4 can be connected as output transducer. The path 5 designates the acoustic path of the wave emitted by the input transducer 3. The path 5 is parallel to the main wave propagation direction E of the transducer 3. The path 5 leads into a first reflector $6_1$ at the reflector fingers of which, which are slightly oblique in accordance with the acute angle of reflection, the wave of the path 5 is reflected back in the direction of the path 7. The reflected wave thus proceeds in the direction of the path 7 to a second reflector $6_2$ which compensates the reflection effect of the reflector $6_1$ with respect to its reflector direction in such a way that a wave reflected in the reflector $6_2$ is produced which proceeds along the path 8 into the output transducer 4. The paths 5 and 8 of the acoustic wave are parallel to one another and the direction of the path 7 extends at an acute angle to the paths 5 and 8, namely dimensioned such that the change of direction is greater than 155° and less than 180°. Input transducer and output transducer 3, 4 lie in adjacent main wave propagation directions E, A, as is shown in FIG. 1. Element S designates a conventional damping element for wave damping.

FIG. 1 additionally shows such an arrangement of the transducers 3 and 4 relative to one another in which the two transducers are offset to one another, viewed perpendicularly to their main wave propagation directions E, A. As a result, orthogonal acoustic (transverse) waves emitted by the input transducer 3 cannot proceed into the output transducer 4, but rather pass it by (viewed perpendicularly to its main wave propagation direction A).

FIG. 2 shows an extended embodiment of FIG. 1, namely with an additional reflector 13 and 14 in each case. The reflector 13 has (like the reflector 14) reflector fingers arranged perpendicularly with respect to the main wave propagation direction E of the input transducer 3.

The reflector 13 serves to reflect back acoustic waves emitted by the input transducer 3 (toward the left in FIG. 2) into and through the transducer 3 into the reflector $6_1$. The combination of the input transducer 3 with the reflector 13 thus makes the input transducer 3 a unidirectional transducer, which as a result emits its entire wave energy into the reflector $6_1$ and further to the output transducer. The same applies analogously to the additional reflector 14 for the output transducer 4 which reflects acoustic waves reaching the reflector 14 (from the left in FIG. 2) back to the left again into the output transducer 4. With respect to the arrangement of the transducer 3 and the reflector 13 relative to one another, and of the transducer 4 and the reflector 14 relative to one another, the known phase conditions must be complied with so that the transducer 3 emits an amplified wave and the transducer 4 receives the amplified acoustic wave.

Instead of a combination as described above, a unidirectional transducer in accordance with U.S. Pat. No. 4,736,172 can also be provided in each case.

FIG. 3 diagrammatically shows a further refinement, again with input transducer 3 and output transducer 4 and four reflectors on the substrate 2. The transducers 3 and 4 act together with the reflectors $6_1$ and $6_2$ as is described for FIG. 1. The reflectors $6_{11}$ and $6_{12}$ are further reflectors which serve to reflect acoustic waves starting from the input transducer 3 along the path $5_1$, along the path $7_1$ into the reflector $6_{12}$, and from the latter along the path $8_1$ into the transducer 4. In its effectiveness, the filter of FIG. 3 corresponds to the filter 3 to a certain extent, since input transducer and output transducer have no one-sided radiation losses of the acoustic wave.

Filters such as those of FIGS. 2 and 3 also do not necessarily require any damping means (sump) as is the case, for example, for a filter of FIG. 1 to the left of the transducer 3 (and to the right of the transducer 4).

Figure 4:
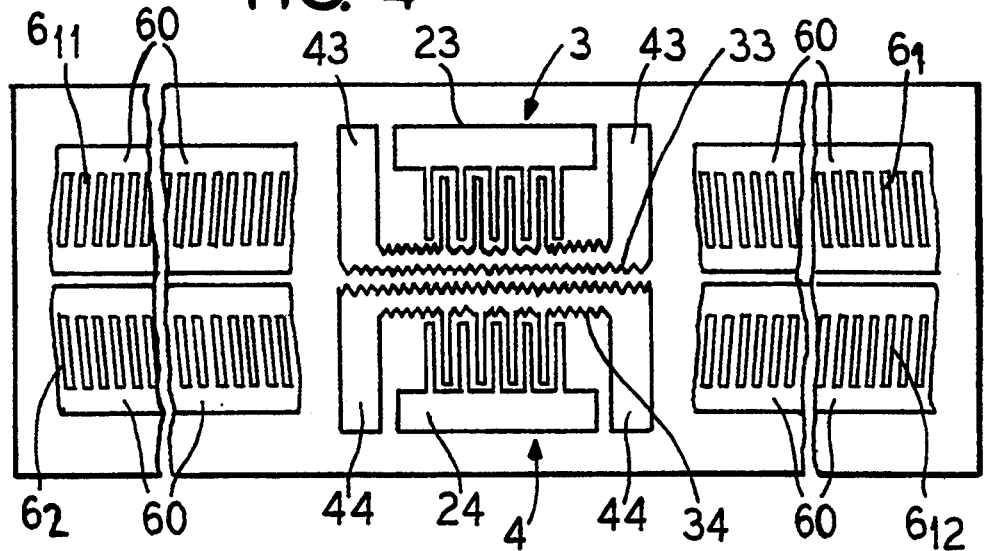
FIG. 4 shows a practical embodiment of a filter according to FIG. 3.

FIG. 4 shows the design of a filter of FIG. 3 in a detailed illustration. The details of FIG. 3 already mentioned with reference symbols have the same meaning in FIG. 4. Element 3 thus again designates an interdigital transducer assumed to be operated as input transducer. Element 23 designates the busbar, simultaneously serving as terminal pad, of the interdigital fingers of the transducer 3. The other busbar of the transducer 3 is designated 33. The edges of the busbar 33 have a reflection-reducing corrugated structure such that there are provided to the input transducer and output transducer dual acoustic paths to the two ends of the input and output transducers in each case, wherein there are arranged in each of these dual paths two series-connected reflectors which bring about the changes of direction. Element 43 and an elemental 44 correspondingly designates metallization surfaces. The busbars 24 and 34, the latter again with corrugated edge structure and the metallization surfaces 44, belong to the interdigital transducer 4. The reflectors $6_1$, $6_{11}$, $6_2$ and $6_{12}$ in are 60 have reflector fingers, in each case obliquely oriented with a small angle to the main wave propagation direction E and A respectively, and metallization surfaces arranged laterally in the manner of a busbar.

Figure 5:
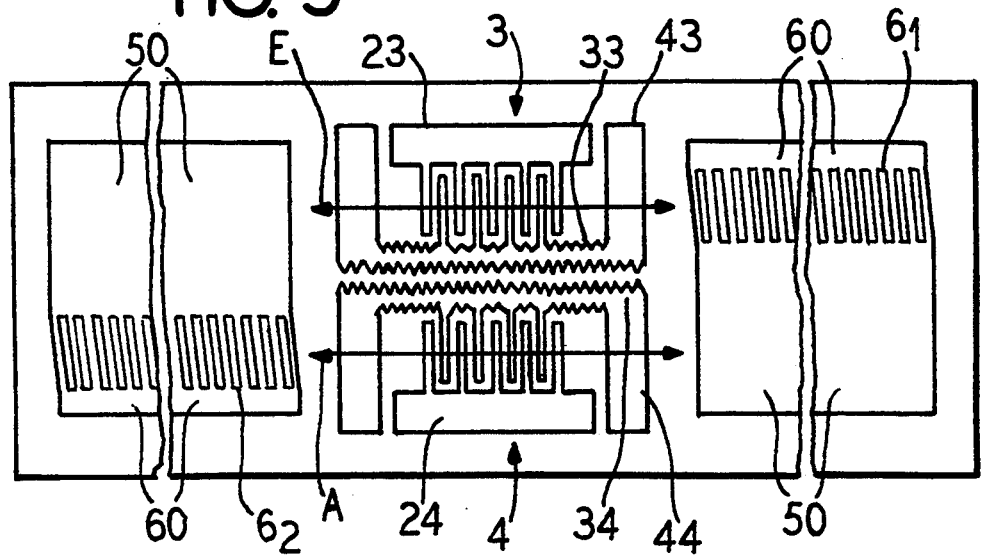
FIG. 5 shows a practical embodiment of a filter according to FIG. 1.

FIG. 5 shows a design in accordance with the diagram of FIG. 1. With respect to the transducers 3 and 4, the design corresponds to that of FIG. 4. The reflectors $6_1$ and $6_2$ again have obliquely placed reflector fingers. 50 designates additional metallization surfaces on the surface of the substrate which are provided outside the transducers and reflectors for equalizing the wave propagation conditions.

The object of a further development of the invention is to achieve in a filter according to the invention that the ratio of wanted signal to interference signal is improved still further.

This object is achieved by a surface-wave reflector filer as set forth above, wherein, for a further improved ratio of wanted signal to interference signal, two such filter structures having the same construction are connected electrically parallel as partial filters in such a way that the respective output or input transducers respectively are electrically connected to one another with opposite phase, and the input or output transducers respectively are electrically connected to one another with equal phase. The acoustic path of the wanted signal between input transducer and output transducer in the one partial filter, by position of the reflectors in the material of the substrate at the mid-frequency of the filter, differs from the acoustic path of the wanted signal in the other partial filter by $(2n-1)$ times half the wavelength of the acoustic wave. The arrangement and position of input transducer and output transducer relative to one another in the one partial filter are identical to the mutual arrangement and position of input transducer and output transducer in the other partial filter. Unidirectional input/output transducers are provided and two partial filters are provided with in each case a dual acoustic path. The structures of both partial filters are provided on a single-piece substrate or, alternatively, each of the partial filters is realized on its own substrate and the partial filters are only connected together electrically.

This further development is based on the idea of coupling preferably two, but if necessary also more than two, surface-wave reflector filters according to the invention together electrically parallel as partial filters of the overall filter of the further development. For example, two parallel-connected reflector filters of the overall filter can be realized on the surface of one and the same substrate. However, it may also be advantageous to connect two individual reflector filters according to the invention arranged on separated substrates parallel to one another. In both cases, however, the two filters must differ in respect of (one) detail(s), will be explained in greater detail below. The two filters are otherwise identical to one another, in particular with respect to the arrangement, positioning and design of the insertion and extraction of the input and output transducers of each of the partial filters.

The present further development is based on such a parallel electrical connection (and the further measures), with which the interference signals of each individual one of the two partial filters are compensated in the output of the overall filter developed further according to the invention by phase-opposed adding of the interference signals, but the wanted signal of the two reflector filters connected parallel with one another is added. It is of essential importance here that the two filters are in principle the same, that is to say are identical except for one respective difference, so that the interference signals transmitted in the respective filter from the input to the output as a result of crosstalk are identical (with the exception of their respective phase with which they occur at the output of the filter). Thus, for example, the input transducers of the two partial filters connected parallel to one another can be connected in parallel with equal phase, viewed from the input of the overall filter developed further according to the invention, and an electrical connection of the respective output transducers of the two partial filters is provided which has opposite phase with respect to the output of the overall filter. As a result, the inevitable interference signals transmitted then cancel each other out. However, so that the wanted signal is not canceled out as well, the two partial filters differ, in that, between input transducer and output transducer of the one partial filter in comparison with the other partial filter, an acoustic path difference of $(2n-1)$ times half the wavelength of the acoustic wave (of the wanted signal) is present in the substrate material of the filter for the respective wanted signal, where n is a natural number, preferably 1. An alternative of this variant of the invention is one in which the electrical connection of the outputs of the output transducers of the two partial filters has the same phase, and the input transducers are connected to one another with opposite phase, in relation to the input of the overall filter.

Figure 6:
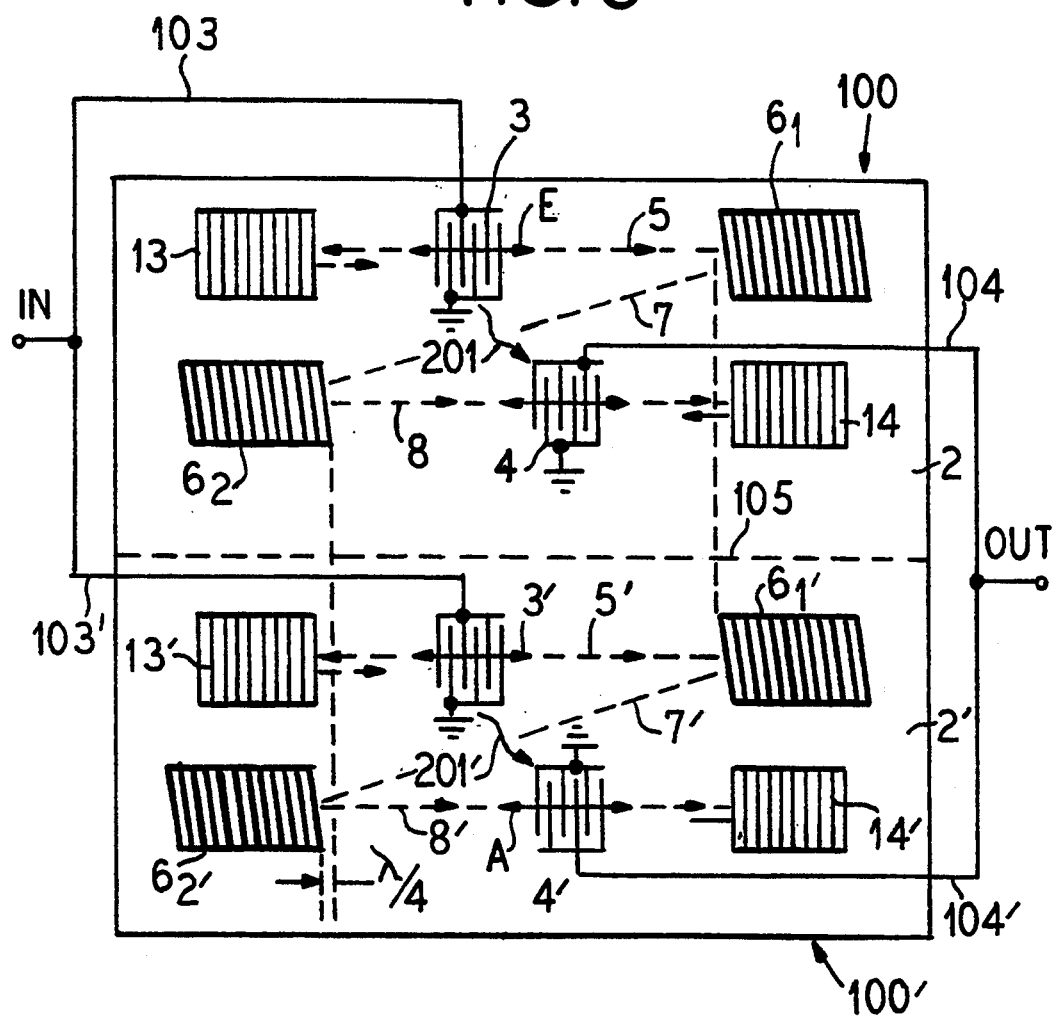
FIG. 6 shows a basic representation of a further development of the filter according to FIG. 2.

FIG. 6 shows a filter according to FIG. 2. The embodiment described in FIG. 2 of a surface-wave filter according to the invention is to be advantageously used in the present further development as a partial filter. However, the other embodiments of FIGS. 1 and 3 are also readily possible for use as partial filters for this further development. It should be noted here that a filter according to FIG. 3 (contained in FIG. 7) has "twin formations" (5, 7, 8 and 5', 7', and 8') of the acoustic paths of the wanted signal, so that the dimensioning rule specified above for the present further development for the path difference of $(2n-1)$ times half the wavelength for the one partial filter in relation to the other partial filter must be complied with in the overall filter of this further development for the two aforesaid "twin paths".

At least one of the two reflectors $6_1$ and/or $6_2$ must also be designed to be weighted and/or dispersive as partial filter for the present further development.

FIG. 6 shows an overall filter of the further development, to be precise with two partial filters 100, 100' in accordance with FIG. 2, specifically in a first variant with electrically phase-opposed parallel connection of the output transducers given equiphase parallel connection of the input transducers. The two partial filters 100, 100' are adjacent along line 105.

In FIG. 6 the substrate is designated 2, 2'. For the one partial filter 100, the reference symbol 3 is selected for the input transducer and the reference symbol 4 is selected for the output transducer. Elements $6_1$ and $6_2$ designate the associated reflectors and 5, 7 and 8 designate the specified partial acoustic paths of the wanted signal in the partial filter 100. The other partial filter 100' has the input transducer 3', the output transducer 4' and the reflector structures $6_1'$ and $6_2'$. Element 103 and 103' designate the electrical connection lines not connected to ground between the filter input IN and the "hot" busbar of the input transducers 3, 3'. The respective other busbar of the transducers 3, 3' is connected (as indicated) to ground. As can be seen, the input transducers 3, 3' are connected electrically in parallel with equal phase. 104 and 104' designate the corresponding connection lines between the filter output OUT and the "hot" busbars of the output transducers 4 and 4'. The respective other busbars of the output transducers 4, 4' are connected (as indicated) to ground. The phase-opposed parallel electrical connection of the output transducers 4 and 4' can be seen in FIG. 6. 201 and 201' indicate electrical and/or acoustic crosstalk within the partial filter 100 and within the partial filter 100' respectively.

The phase-opposed parallel connection of the output transducers 4, 4' (with equiphase parallel connection of the input transducers 3, 3') provided in this exemplary embodiment of FIG. 6 results in a mutual cancellation of the interference signals of the paths 201 and 201' at the output OUT of the filter, it being assumed for the further development however that the arrangement and positioning on the one hand of the transducers 3 and 4 relative to one another and on the other hand of the transducer 3' and 4' relative to one another is identical, so that phase differences between the paths 201 and 201' do not occur in practice.

In order that this mutual cancellation does not however occur for the wanted signals of the paths 5, 7, 8 on the one hand and the paths 5', 7', 8' on the other hand, one of the acoustic paths is selected to be different by $(2n-1)$ times half the wavelength of the acoustic wave, where $n=1$ is preferred. This length difference is indicated in FIG. 6 by the offset of the reflector structure $6_2'$ in the partial filter 100' with respect to the positioning of the reflector structure $6_2$ in the partial filter 100. As a result of the dual path of the reflected radiation, an offset of a quarter of the wavelength must be provided there. The reflector structure $6_2'$ is shifted by this amount to the left in FIG. 6 (in relation to the reflector structure $6_2$). This is a slightly noticeable difference between the partial filters 100 and 100', but it is important for the further development in conjunction with the aforesaid identical arrangement and positioning of the transducers 3, 4 and 3', 4' respectively.

The path difference for the wanted signal can also be effected by shortening the path in the partial filter 100'. It may also be provided that the reflector structure $6_1'$ is positioned with a corresponding shift. Incidentally, with respect to the above, the partial filter 100 and the partial filter 100' can be swapped with one another.

A variation of the further development consists in connecting the input transducers 3, 3' of the two partial filters in parallel with opposite phase in relation to the input IN, and in connecting the output filters 4, 4' in parallel with equal phase in relation to the output OUT. In this case, too, the compliance with the aforesaid conditions with respect to the arrangement and positioning of the transducers 3 and 4, and 3' and 4' respectively relative to one another is important so that no mutual phase differences occur there.

It is also inherently possible to realize the further development in that precisely these transmission paths 201 and 201' of the interference signal have a 180° phase difference and the transducers 3 and 3' and 4 and 4' respectively are connected in parallel in each case in identical fashion in relation to the input and to the output of the filter. This possible further embodiment of the further development is however not always in all cases as favorable as the embodiments with equiphase/ phase-opposed parallel connection of the input transducers-/output transducers (as illustrated in FIG. 6).

The above-described variations of the further development can also be realized in an arrangement wherein the structures of the two partial filters 100, 100' are arranged on one and the same substrate 2, 2', as is indicated in FIG. 6. However, the dashed line 105 indicates that it is also possible to provide two individual substrates 2 and 2'. Said partial filters 100, 100' separate from one another in terms of their substrate can also be arranged spatially separate from one another in a corresponding circuit arrangement, namely as long as the conditions described above for the further development, in particular also with respect to the paths 201 and 201', are complied with. In the case of spatial separation, it should also be ensured that other external influences, for example magnetic fields, cannot impair the compliance with the abovementioned conditions with respect to the paths 201 and 201'.

Figure 7:
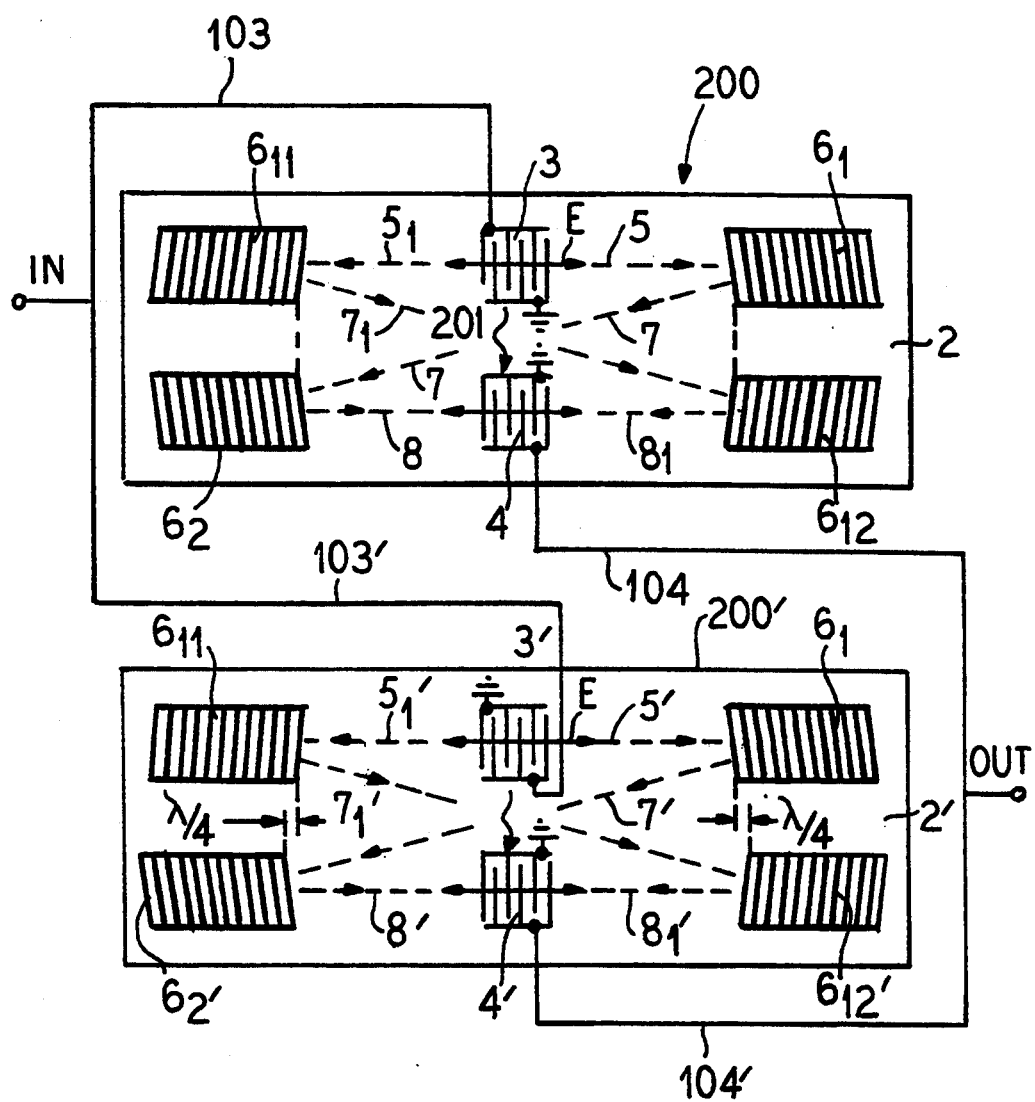
FIG. 7 shows a basic representation of a further development of the filter according to FIG. 3.

FIG. 7 shows an embodiment with two partial filters 200, 200', each of which are in themselves identical to a filter of the embodiment according to the invention of FIG. 3. The partial filter 200 has the details matching those of FIG. 1, these details having the designations already described with reference to FIG. 1. $6_{11}$ and $6_{12}$ designate two further reflector structures which are provided instead of the reflector structures 13 and 14. The reflector structures $6_{11}$ and $6_{12}$ reflect the acoustic radiation propagating from the input transducer 3 in the main wave propagation direction E in exactly the same manner as the reflector structures $6_1$ and $6_2$ with the additional wanted signal path $5_1$, $7_1$ and $8_1$. According to the invention, the wanted signals of the paths 5, 7 and 8 on the one hand and $5_1$, $7_1$ and $8_1$ on the other hand are superpositioned on one another in the output transducer 4 to form the output wanted signal.

The second partial filter 200' of the embodiment according to FIG. 7 is identical to the partial filter 00 except for the path length difference provided for the wanted signal according to the invention. The reference symbols of the details of the partial filter 200' provided with "'" denote the corresponding details of the partial filter 200. It also applies to the partial filters 200 and 200' that the arrangement and positioning of the input transducers and output transducers (3 and 4, and 3' and 4' respectively) are identical to one another and that the wanted signal path in the partial filter 200' differs by $(2n-1)$ times half the wavelength of the acoustic wave, wherein in the present case this difference must be fulfilled for both wanted signal paths of the partial filters 200 and 200' that is to say the wanted signal paths 5', 7' and 8' on the one hand and $5_1'$, $7_1'$ and $8_1'$ are identical to one another (or only differ by whole multiples of the wavelength), but they differ from the wanted signal paths 5, 7 and 8, or $5_1$, $7_1$ and $8_1$ respectively (which in turn preferably have the same length or differ by only whole multiples of the wavelength) by in each case $(2n-1)$ times half the wavelength of the acoustic wave in the material of the substrate.

Constructional additions to the partial filters 100, 100' and 200, 200' respectively can preferably be realized in accordance with the embodiments of FIGS. 5 and 6.

It is also possible in the present further development to arrange the input transducers and output transducers in the partial filters with a lateral offset in the direction of their respective main wave propagation direction in the overall further developed filter (FIGS. 6 and 7), in order in this way to minimize crosstalk as a result of transverse waves. The input transducers and/or output transducers may be unidirectional transducers, as in FIG. 6. In the present further development it is also possible to provide additional metallization surfaces on the surface of the substrate outside the transducers and reflector structures to equalize the wave propagation conditions. The measure of providing mutually opposite edges of the busbars of transducers and/or reflectors on the surface of the substrate with a corrugated structure, so that total reflection of an acoustic wave at such a corrugated edge is precluded, can also be advantageous for the present further development.

The parallel connections are asymmetrical in each case. The input transducers and output transducers can also be connected and switched for symmetrical input IN and output OUT respectively.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A reflector filter operating with surface acoustic waves, comprising:
    an input transducer having an associated single main wave propagation direction,
    an output transducer having an associated single main wave propagation direction,
    a substrate having a surface for propagating acoustic waves and said input and output transducers being arranged on said surface such that there is no coincidence of the input transducer main wave propagation direction and the output transducer main wave propagation direction,
    two reflectors disposed along a respective acoustic path located between the input transducer and the output transducer, said reflectors arranged relative to the input and output transducers and to one another such that the acoustic wave propagating between the input and output transducers has two series-connected changes of direction, each change of direction defining a respective angle and the angles of each of the changes of directions having equal values, and each of said angles of said respective changes of directions of the acoustic wave in a respective reflector being greater than 155° and less than 180°, so that an essentially Z-shaped or inverted Z-shaped wave propagation path is produced from the input transducer to the output transducer.

2. The reflector filter as claimed in claim 1, wherein each of said input transducer and said output transducer further generates transverse directed waves relative to the respective main wave propagation direction, and wherein said input transducer and said output transducer are arranged such that their respective main wave propagation directions are parallel and with at least a wide lateral offset with respect to one another in the direction of their respective main wave propagation direction such that crosstalk as a result of transverse directed waves is avoided.

3. The reflector filter as claimed in claim 1, wherein at least one of said input transducer and said output transducer is an unidirectional transducer.

4. The reflector filter as claimed in claim 3, wherein, for an unidirectional effect of a respective transducer that has a respective main wave propagation direction, an additional 180° reflector is provided for the respective transducer which is arranged in the direction of the respective main wave propagation direction opposite to a respective one of said two reflectors relative to the respective transducer.

5. The reflector filter as claimed in claim 3, wherein the unidirectional transducer is a multi-phase transducer.

6. The reflector filter as claimed in claim 1, wherein additional metallization surfaces are provided on the surface of the substrate adjacent the input and output transducers and reflectors for equalizing wave propagation conditions such that compensation is provided for any inequalities in the wave propagation along the acoustic path located between the input and output transducers.

7. The reflector filter as claimed in claim 1, wherein each of said input and output transducers has at least one busbar with mutually opposite edges, and wherein the mutually opposite edges of a respective busbar of said input and output transducers on the surface of the substrate have a corrugated structure such that total reflection of an acoustic wave at such a corrugated edge is precluded.

8. A reflector filter operating with surface acoustic waves, comprising:
    an input transducer having an associated single main wave propagation direction,
    an output transducer having an associated single main wave propagation direction,
    a substrate having a surface for propagating acoustic waves and said input and output transducers being arranged on said surface such that there is no coincidence of the input transducer main wave propagation direction and the output transducer main wave propagation direction,
    two reflectors disposed along a respective acoustic path located between the input transducer and the output transducer, said reflectors arranged relative to the input and output transducers and to one another such that the acoustic wave propagating between the input and output transducers has two series-connected changes of direction, each change of direction defining a respective angle and the angles of each of the changes of directions having equal values, and each of said respective angles of said changes of directions of the acoustic wave in a respective reflector being greater than 155° and less than 180°, so that an essentially Z-shaped or inverted Z-shaped wave propagation path is produced from the input transducer to the output transducer,
    each of the input and output transducers having opposed first and second ends, and there being provided to the input transducer and output transducer dual acoustic paths to respective opposed first and second ends of each of the said input and output transducers, and each of these dual acoustic paths having two corresponding reflectors which bring about said corresponding changes of direction.

9. The reflector filter as claimed in claim 8, wherein each of said input transducer and said output transducer further generates transverse directed waves relative to the respective main wave propagation direction and wherein said input transducer and said output transducer are arranged such that their respective main wave propagation directions are in parallel and with at least a wide lateral offset with respect to one another in the direction of their respective main wave propagation direction such that crosstalk as a result of transverse directed waves is avoided.

10. A reflector filter assembly operating with surface acoustic waves, comprising:
    two filter structures, each filter structure having, an input transducer having an associated single main wave propagation direction,
    an output transducer having an associated single main wave propagation direction,
    a substrate having a surface for propagating acoustic waves and said input and output transducers being arranged on said surface such that there is no coincidence of the input transducer main wave propagation direction and the output transducer main wave propagation direction, two reflectors disposed along a respective acoustic path located between the input transducer and the output transducer, said reflectors arranged relative to the input and output transducers and to one another such that the acoustic wave propagating between the input and output transducers has two series-connected changes of direction, each change of direction defining a respective angle and the angles of each of the changes of directions having equal values, and each of said respective angles of said changes of directions of the acoustic wave in a respective reflector being greater than 155° and less than 180°, so that an essentially Z-shaped or inverted Z-shaped wave propagation path is produced from the input transducer to the output transducer;

for a further improved ratio of wanted signal to interference signal, said two filter structures connected electrically parallel as partial filters such that the partial filters are electrically connected to one another such that said input transducers are connected to one another with equal phase and said output transducers are connected to one another with unequal phase, the acoustic path of the wanted signal between input transducer and output transducer in one partial filter, due to the position of the reflectors in a material of the substrate at mid-frequency of the filter, differing from the acoustic path of the wanted signal between the input transducer and the output transducer in the other partial filter by $(2n-1)$ times half the wavelength of the acoustic wave, and the mutual arrangement and position of the input transducer and the output transducer relative to one another in the one partial filter being identical to the mutual arrangement and position of the input transducer and the output transducer in the other partial filter.

11. The reflector filter as claimed in claim 10, wherein each of the two partial filters have a dual acoustic path.

12. The reflector filter as claimed in claim 10, wherein each of said input and output transducers of each partial filter has at least one busbar with mutually opposite edges, and wherein the mutually opposite edges of a respective busbar of said input and output transducers of each partial filter on the surface of the substrate have a corrugated structure such that total reflection of an acoustic wave at such a corrugated edge is precluded.

13. The reflector filter as claimed in claim 10, wherein each of said input transducer and said output transducer further generates transverse directed waves relative to the respective main wave propagation direction, and wherein each said input transducer and each said output transducer are arranged such that their respective main wave propagation directions are in parallel and with at least a corresponding wide lateral offset with respect to one another in the direction of their respective main wave propagation direction such that crosstalk as a result of transverse directed waves is avoided.

14. The reflector filter as claimed in claim 10, wherein at least one of the input transducers and the output transducers of each partial filter are unidirectional transducers.

15. The reflector filter as claimed in claim 14, wherein, for an unidirectional effect of a respective transducer that has a respective main wave propagation direction, an additional 180° reflector is provided for the respective transducer which is arranged in the direction of the respective main wave propagation direction opposite to a respective one of said two reflectors relative to the respective transducer.

16. The reflector filter as claimed in claim 14, wherein each unidirectional transducer is a multi-phase transducer.

17. The reflector filter as claimed in claim 10, wherein additional metallization surfaces are provided on the surface of the substrate adjacent each of the input and output transducers and reflectors for equalizing wave propagation conditions such that compensation is provided for any inequalities in the wave propagation along the acoustic path located between each of the input and output transducers.

18. A reflector filter assembly operating with surface acoustic waves, comprising:

two filter structures, each filter structure having, an input transducer having an associated single main wave propagation direction, an output transducer having an associated single main wave propagation direction, a substrate having a surface for propagating acoustic waves and said input and output transducers being arranged on said surface such that there is no coincidence of the input transducer main wave propagation direction and the output transducer main wave propagation direction, two reflectors disposed along a respective acoustic path located between the input transducer and the output transducer, said reflectors arranged relative to the input and output transducers and to one another such that the acoustic wave propagating between the input and output transducers has two series-connected changes of direction, each change of direction defining a respective angle and the angles of each of the changes of directions having equal values, and each of said respective angles of said changes of directions of the acoustic wave in a respective reflector being greater than 155° and less than 180°, so that an essentially Z-shaped or inverted Z-shaped wave propagation path is produced from the input transducer to the output transducer; for a further improved ratio of wanted signal to interference signal, said two filter structures connected electrically parallel as partial filters such that the partial filters are electrically connected to one another such that said input transducers are connected to one another with unequal phase and said output transducers are connected to one another with equal phase, the acoustic path of the wanted signal between input transducer and output transducer in one partial filter, due to the position of the reflectors in a material of the substrate at mid-frequency of the filter, differing from the acoustic path of the wanted signal between the input transducer and the output transducer in the other partial filter by $(2n-1)$ times half the wavelength of the acoustic wave, and the mutual arrangement and position of the input transducer and the output transducer relative to one another in the one partial filter being identical to the mutual arrangement and position of the input transducer and the output transducer in the other partial filter.

19. The reflector filter as claimed in claim 18, wherein each of said input and output transducers of each partial filter has at least one busbar with mutually opposite edges, and wherein the mutually opposite edges of a respective busbar of said input and output transducers of each partial filter on the surface of the substrate have a corrugated structure such that total reflection of an acoustic wave at such a corrugated edge is precluded.

20. The reflector filter as claimed in claim 18, wherein additional metallization surfaces are provided on the surface of the substrate adjacent the input and output transducers of each partial filter and reflectors for equalizing wave propagation conditions such that compensation is provided for any inequalities in the wave propagation along the acoustic path located between the input and output transducers of each partial filter.

21. The reflector filter as claimed in claim 18, wherein each of said input transducer and said output transducer further generates transverse directed waves relative to the respective main wave propagation direction, and wherein each said input transducer and each said output transducer are arranged such that their respective main wave propagation directions are in parallel and with at least a corresponding wide lateral offset with respect to one another in the direction of their respective main wave propagation direction such that crosstalk as a result of transverse directed waves is avoided.

22. The reflector filter as claimed in claim 18, wherein a dual acoustic path is provided in each of the two partial filters.

23. The reflector filter as claimed in claim 18, wherein at least one of the input transducers and the output transducers of each partial filer are unidirectional transducers.

24. The reflector filter as claimed in claim 23, wherein, for an unidirectional effect of a respective transducer that has a respective main wave propagation direction, an additional 180° reflector is provided for the respective transducer which is arranged in the direction of the respective main wave propagation direction opposite to a respective one of said two reflectors relative to the respective transducer.

25. The reflector filter as claimed in claim 23, wherein each unidirectional transducer is a multi-phase transducer.

* * * * *